United States Patent [19]

Sinta et al.

[11] Patent Number: 5,917,024
[45] Date of Patent: Jun. 29, 1999

[54] ACID LABILE PHOTOACTIVE COMPOSITION

[75] Inventors: Roger F. Sinta, Woburn; Daniel Y. Pai, Millbury, both of Mass.

[73] Assignee: Shipley Company, L.L.C., Marlborough, Mass.

[21] Appl. No.: 09/027,168

[22] Filed: Feb. 20, 1998

Related U.S. Application Data

[62] Division of application No. 08/812,676, Mar. 8, 1997, Pat. No. 5,858,605.

[51] Int. Cl.$^6$ .................................................. C07C 245/10
[52] U.S. Cl. ................................................................ 534/730
[58] Field of Search ............................................... 534/730

[56] References Cited

U.S. PATENT DOCUMENTS

| | | |
|---|---|---|
| 4,506,003 | 3/1985 | Ruckert et al. . |
| 4,749,807 | 6/1988 | Lapin et al. . |
| 4,775,732 | 10/1988 | Lapin . |
| 5,229,245 | 7/1993 | Lin et al. ................................ 430/190 |
| 5,362,600 | 11/1994 | Sinta et al. . |
| 5,641,604 | 6/1997 | Sinta et al. . |
| 5,648,194 | 7/1997 | Pai et al. . |

FOREIGN PATENT DOCUMENTS

| | | |
|---|---|---|
| 0 520 642 A1 | 12/1992 | European Pat. Off. . |
| 0 536 690 A1 | 4/1993 | European Pat. Off. . |
| 0 552 548 A1 | 7/1993 | European Pat. Off. . |
| WO 92/20014 | 11/1992 | WIPO . |

OTHER PUBLICATIONS

Zahn et al, Chem. Abstracts, vol. 108, No. 177236f, 1988.

*Primary Examiner*—James H. Reamer
*Attorney, Agent, or Firm*—Darryl P. Frickey; Peter F. Corless; Robert L. Goldberg

[57] ABSTRACT

A photoresist composition comprising an alkali soluble resin and the reaction product of an ortho-naphthoquinone diazide sulfonic acid ester and a vinyl ether. In use, the photoresist is characterized by having at least a portion of the hydroxyl groups on the alkali soluble resin reacted with the photoactive compound and then deblocked by acid generation.

9 Claims, No Drawings

5,917,024

ACID LABILE PHOTOACTIVE COMPOSITION

This application is a division of Ser. No. 08/812,676 filed Mar. 8, 1997, U.S. Pat. No. 5,858,605.

BACKGROUND OF THE INVENTION

I. Introduction

This invention relates to positive-working photoresist compositions. More particularly, this invention relates to photoresist compositions containing a light sensitive component that is the condensation product of an o-quinone diazide sulfonyl compound and a vinyl ether. The photoresists of the invention are characterized by increased photospeed and enhanced inhibition.

II. Description of the Prior Art

Photoresist compositions are well known in the art and described in numerous publications including DeForest, *Photoresist Materials and Processes,* McGraw-Hill Book Company, New York, 1975. Photoresist coating compositions are applied from liquid solution or as a dry film. When coated onto a substrate and exposed to light of the proper wavelength, are chemically altered in their solubility to certain solvents (developers). Two types are known. The negative-acting resist is initially a mixture which is soluble in its developer, but following exposure to activating radiation, becomes insoluble in developer thereby defining a latent image. Positive-acting resists work in the opposite fashion, light exposure making the resist soluble in developer.

The photoactive compound used in many positive acting photoresists is an o-quinone diazide sulfonic acid ester of a relatively large molecular weight polyhydroxy phenol. This material is costly relative to the other components of the photoresist. However, photoresists using such photoactive compounds can be developed to yield relief images having linewidths of one micron or less. In addition, considering the cross-section of a photoresist image, the channels formed in the resist by development have square corners and sidewalls with only minimal taper.

The positive-working photoresists typically comprise a light-sensitive component in a film-forming, alkali soluble, thermoplastic polymer binder. The light-sensitive compounds or photoactive compounds most frequently used are esters formed by reacting an o-quinone diazide sulfonyl acid halides with a light insensitive phenol (PACs). The phenol is used to increase the size of the total molecule to thereby prevent loss by sublimation, migration of the PAC within a photoresist coating, and to increase inhibition of the resist. Recently, the industry has moved to use of PACs that are condensation products of several moles of an o-quinone diazide sulfonyl acid halide and a multi ring polyhydroxyphenol to increase the size of the molecule and the number of moles of the light sensitive component substituted on the molecule.

Esters of naphthoquinone diazide sulfonyl halides and phenols are well known in the art and are described by DeForest, supra, pages 47–55, incorporated herein by reference. Such photoactive compounds and the methods used to make the same, are all well documented in prior patents including German Pat. No. 865,140 granted Feb. 2, 1953 and U.S. Pat. Nos. 2,767,092; 3,046,110; 3,046,112; 3,046,119; 3,046,121; 3,046,122; and 3,106,465, all incorporated herein by reference. Additional photoactive compounds that have been used in the formulation of positive-acting photoresists are shown in U.S. Pat No. 3,637,384, also incorporated herein by reference. These materials are formed by reaction of a suitable diazide of an aromatic sulfonyl chloride with an appropriate resin amine. Methods for the manufacture of these photoactive compounds and examples of the same are shown in U.S. Pat. No. 2,797,213, incorporated herein by reference. Other positive-working diazo compounds have been used for specific purposes. For example, a diazo compound used as a positive-working photoresist for deep UV lithography is Meldrum's diazo and its analogs as described by Clecak et al, *Technical Disclosure Bulletin,* Volume 24, Number 4, September 1981, IBM Corporation, pp. 1907 and 1908. An o-quinone diazide compound suitable for laser imaging is shown in U.S. Pat. No. 4,207,107. The aforesaid references are also incorporated herein by reference.

The resin binders most frequently used with the o-quinone diazide photoactive compounds in commercial practice are the alkali soluble phenol formaldehyde resins known as the novolak resins. Photoresists using such polymers are illustrated in U.K. Pat. No. 1,110,017, incorporated herein by reference. These materials are the product of reaction of a phenol with formaldehyde under conditions whereby a thermoplastic polymer is formed with a glass transition temperature of about 100° C. Novolaks with glass transition temperatures in excess of 100° C. are also known and exemplified in U.S. Pat. No. 5,266,440, which discloses novolak resins comprising the product resulting from the acid condensation of an aromatic aldehyde with a phenol resulting in resins having a molecular weight in excess of 1,500 Daltons and glass transition temperatures in excess of 125° C.

Another class of binders used with such photoresists are homopolymers and copolymers of vinyl phenol. Photoresists of this nature are disclosed in U.S. Pat. No. 3,869,292, supra.

In the prior art, the above-described positive resists using alkali soluble phenolic resins as a binder are most often used as masks to protect substrates from chemical etching in photo-engraving processes. For example, in a conventional process for the manufacture of a printed circuit board, a copper-clad substrate is coated with a layer of a positive-working photoresist, exposed to actinic radiation to form a latent circuit image in the photoresist coating, developed with a liquid developer to form a relief image and etched with a chemical etchant whereby unwanted copper is removed and copper protected by the photoresist mask is left behind in a circuit pattern. For the manufacture of printed circuit boards, the photoresist must possess chemical resistance, must adhere to the circuit board substrate, and must be capable of fine-line image resolution.

Similar photoresists are also used in the fabrication of semiconductors. As in the manufacture of printed circuits, the photoresist is coated onto the surface of a semiconductor wafer and then imaged and developed. Following development, the wafer is typically etched with an etchant whereby the portions of the wafer bared by development of the photoresist are dissolved while the portions of the wafer coated with photoresist are protected, thereby defining a circuit pattern. For use in the manufacture of a semiconductor, the photoresist must possess resistance to chemical etchants, must adhere to the surface of the semiconductor wafer and must be capable of very fine-line image resolution.

Positive working photoresists are more expensive than negative working photoresists due primarily to the cost of the PAC. This component is costly and used in significant concentration. Though it is disclosed in the literature that o-quinone diazide PACs may be used in amounts of only several percent of the total solids content of the photoresist, in commercial practice, it has been found that the PAC is required in amounts of at least about fifteen percent by weight to provide a photoresist coating capable of providing a high resolution image. For this reason, it is recognized in the art that it would be desirable to find a means to maintain the resolution capability of a photoresist coating while reducing the concentration of the naphthoquinone diazide sulfonic acid ester PAC component or to improve the resolution capability of such a coating without concomitant increase in the concentration of the PAC.

In U.S. patent application Ser. No. 08/510,709 filed Aug. 3, 1995, assigned to the same assignee as the subject application and incorporated herein by reference, a photoresist composition is disclosed comprising an alkali soluble resin binder, a naphthoquinone diazide sulfonic acid ester PAC and a vinyl ether compound. The photoresist is one characterized by a reduced PAC concentration and increased photospeed, both made possible by addition of the vinyl ether compound to the photoresist composition. The vinyl ether compound used was of the type disclosed in European Published Patent Application 0 536 690 incorporated herein by reference. It is known that photoresist photospeed and image resolution are in large part directly correlated with PAC concentration—i.e., photospeed and resolution increase proportionately as PAC concentration increases. Therefore, it is stated to be an unexpected discovery of the invention that addition of the vinyl ether compound to a photoresist permitted reduction in PAC concentration while image resolution was maintained and photospeed increased rather decreased as would be expected from a reduction in PAC concentration. Moreover, it was reported to have been found that an increase in photospeed was achieved even when less than a molar equivalent of vinyl ether was substituted for the PAC. For example, it is stated that photospeed increased even when the molar ratio of vinyl ether substitution to PAC was 1 to 2.

SUMMARY OF THE INVENTION

The present invention is directed to a new photoactive compound and to a photoresist composition comprising an alkali soluble resin binder and a the new photoactive compound. The photoactive compound is the reaction product of a naphthoquinone diazide sulfonyl halide and a functionalized vinyl ether. The photoresist is characterized by improved image resolution at reduced PAC concentration or increased photospeed.

Without wishing to be bound by theory, it is believed that improved properties are obtained because both portions of the photoactive compound molecule, i.e., both the o-naphthoquinone diazide sulfonic acid and the vinyl ether, participate in the photolithographic reaction. The suggested mechanism is as follows. The first step in the formation of a photoresist coating is coating a liquid solution of the photoresist onto a substrate. The wet film is then subjected to a conventional drying step, the first bake, to evaporate solvent from the film. During the drying step, it is believed that the vinyl ether portion of the molecule reacts with hydroxyl groups on the resin portion of the resist through pendant hydroxyl groups to form an acetal group. This bonding eliminates the need for a large ballast group for the PAC. The bonding also enhances inhibition properties of the coating as the bond between the PAC and the resin in effect blocks the hydroxyl groups on the resin. When the vinyl ether portion of the PAC has more than one double bond, multiple bonds are formed between the PAC and the resin thereby crosslinking the resin. When the dried coating is exposed to activating radiation, the exposed o-naphthoquinone diazide portion of the PAC is altered to form an aqueous soluble indene carboxylic acid in the light exposed areas of the coating. This photogenerated indene carboxylic acid cleaves the acetal groups where the coating is light exposed thus breaking the bond between the resin and the PAC without cleavage of the bond in those areas of the coating where exposure has not occurred. Consequently, differential dissolution properties are superior compared to photoresist coatings free of a vinyl ether component.

DESCRIPTION OF THE PREFERRED EMBODIMENTS

The photoresists of this invention comprise an organic solution of an alkali soluble resin and the reaction product of an o-quinone diazide sulfonic acid halide and a vinyl ether.

The alkali soluble resin component of the photoresist is typically an acrylic resin or a phenolic resin such as a novolak resin or a polyvinyl phenol resin. Procedures for the preparation of conventional novolak and polyvinyl phenol resins used as photoresist binders are well known in the art and disclosed in numerous publications including those discussed above. Novolak resins are the thermoplastic condensation products of a phenol and an aldehyde. Examples of suitable phenols for condensation with an aldehyde, especially formaldehyde, for the formation of novolak resins include phenol, m-cresol, o-cresol, p-cresol, 2,4-xylenol, 2,5-xylenol, 3,4-xylenol, 3,5-xylenol, and thymol. An acid catalyzed condensation reaction results in the formation of a suitable novolak resin which may vary in molecular weight from about 500 to 100,000 daltons. The preferred novolak resins conventionally used for the formation of photoresists are the cresol formaldehyde condensation products.

Polyvinyl phenol resins are thermoplastic polymers that may be formed by block polymerization, emulsion polymerization or solution polymerization of the corresponding monomers in the presence of a cationic or free radical catalyst. Vinylphenols useful for the production of polyvinyl phenol resins may be prepared, for example, by hydrolysis of commercially available coumarin or substituted coumarins, followed by decarboxylation of the resulting hydroxy cinnamic acids. Useful vinylphenols may also be prepared by dehydration of the corresponding hydroxy alkyl phenols or by decarboxylation of hydroxy cinnamic acids resulting from the reaction of substituted or non-substituted hydroxybenzaldehydes with malonic acid. Preferred polyvinyl phenol resins prepared from such vinylphenols have a molecular weight range of from about 2,000 to about 100,000 daltons.

Other suitable phenolic resins include polystyrenes and copolymers of phenol and cyclic alcohols. The copolymer of a phenol and a cyclic alcohol may be formed by copolymerizing a phenol with a cyclohexanol or by hydrogenating a known phenolic resin. Details for the formation of such copolymers are disclosed in U.S. Pat. No. 5,258,257, incorporated herein by reference.

Non-phenolic resins are also suitable for use as a binder for the photoactive compounds of the invention. Acrylic resins comprise a preferred binder. For example, a copolymer of an alkyl acrylate such as t-butylacrylate or t-butylmethyacrylate and a vinyl alicyclic such as a vinyl norbornyl or vinyl cyclohexanol compound may be used as a resin binder in compositions of the invention. Such copolymers also may be prepared by such free radical polymerization or other known procedures and suitably will have a Mw of from about 8,000 to about 50,000, and a molecular weight distribution of about 3 or less.

The photoactive compound used in combination with the alkali soluble resin to formulate a photoresist in accordance with the invention is the condensation product of a o-quinone diazide sulfonyl halide and a vinyl ether. The o-quinone diazide sulfonyl compound conforms to the formula:

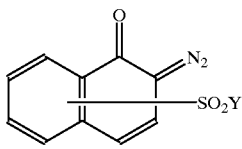

where the sulfonyl group is generally in the 4 or 5 position and Y typically represents halogen, especially chlorine and bromine, but may also represent hydroxyl, amine and —OM where M is an alkali or alkaline earth metal. Specific examples of naphthoquinone diazide sulfonic acid compounds are 1,2-naphthoquinonediazide-5-sulfonyl chloride and 1,2-naphthoquinonediazide-4-sulfonyl chloride.

The sulfonyl compound represented above may be part of a PAC where it is condensed with a phenol such as the PACs illustrated in the aforesaid referenced U.S. patent application Ser. No. 08/510,709. Preferred phenols include polyhydroxy phenols such as polyhydroxy benzenes such as resorcinol, pyrogallol, and glucinol; polyhydroxy phenylalkylketones such as 2,4-dihydroxy phenolpropylketone, 2,4-dihydroxy phenyl-N-hexylketone, and 2,3,4-trihydroxy phenyl-N-hexylketone; polyhydroxy phenalylketones such as 2,4-dihydroxy benzophenone, 2,3,4-trihydroxy benzophenone, 2,4,6-trihydroxy benzophenone, 2,4,2',4'-tetrahydroxy benzophenone, 2,3,4,4'-tetrahydroxy benzophenone, 2,3,4,2',4'-pentahydroxy benzophenone, 2,3,4,2',6'-pentahydroxy benzophenone, 2,3,4,3',4',5'-hexahydroxy benzophenone, 2,4,6,3',4',5'-hexahydroxy-5-chloro benzophenone, and 2,3,4,3',4',5'-hexahydroxy-5-benzoyl benzophenone, bis (polyhydroxy phenyl) alkanes such as bis (2,4-dihydroxy phenyl) methane, 2,2-bis(2,4-dihydroxy phenyl) propane and 2,2-bis(2,3,4-trihydroxy phenyl) propane, alkyl polyhydroxy benzoic ester or allyl polyhydroxy benzoic ester such as propyl 3,4,5-trihydroxy benzoic ester and phenyl, 3,4,5-trihydroxy benzoic ester, bis(polyhydroxy benzyl) alkanes such as bis(2,4-dihydroxy benzoyl) methane, bis (2,3,4-trihydroxy benzoyl) methane, bis (2,4,6-trihydroxy benzoyl) methane, and 2,2-bis(2,3,4-trihydroxy phenyl) propane, bis (polyhydroxy benzoyl) benzenes such as p-bis(2,5-dihydroxy benzoyl) benzene, p-bis(2,3,4-trihydroxy benzoyl) benzene and p-bis(2,4,6-trihydroxy benzoyl), alkanediol di(polyhydroxy benzoate) such as ethyleneglycol di(3,5-dihydroxy benzoate), ethyleneglycol di(3,4,5-trihydroxy benzoate), 1,4-butanediol(3,4,5-trihydroxy benzoate) and 1,8 octanediol di (3,4,5-trihydroxy benzoate), polyethyleneglycol di (polyhydroxy benzoate) such as diethylene glycol di (3,4,5-trihydroxy benzoate) and triethyleneglycol di (3,4,5-trihydroxy benzoate), etc.

To form compounds of the invention, the functional group on the vinyl ether compound is reacted with the o-quinone diazide sulfonyl compound. The vinyl ether group is bonded to hydrogen if it is a terminal group or bonded to a fragment of an organic compound if the vinyl ether group is a divalent internal group. The vinyl ether compound may have one or more vinyl ether groups. Groups reactive with a sulfonyl derivatives include amine, hydroxyl, isocyanate, carboxy, thiol, etc.

Typical vinyl ether compounds having a single vinyl ether group and suitable for purposes of the invention include compounds conforming to one of the following generic formulas:

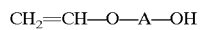

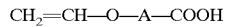

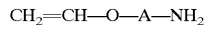

where A represents a linear or branched alkylene group having 1 to 10 carbon atoms. Such compounds include hydroxybutylvinyl ether, aminopropylvinyl ether, hexanediolmonovinyl ether, ethyleneglycolmonovinyl ether, butanediolmonovinyl ether, hexanediolmonovinyl ether, cylcohexanedimethanolmonovinyl ether, diethyleneglycolmonovinyl ether, etc. Compounds having two or more vinyl groups include 2-hydroxycyclohexane-1,6-dimethanol divinyl ether, 2-hydroxypropanediol-1,3-divinyl ether, 2-aminopropanediol-1,3-divinyl ether, 4-hydroxyheptanediol-1,4-divinyl ether, 4-aminoheptanediol-1,7-divinyl ether, etc. Additional examples of vinyl ethers may be found in the above referenced EPO application 0 536 690.

The reaction between the vinyl ether and the o-quinone diazide sulfonyl reactant may be represented by the following equation:

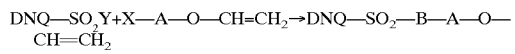

where DNQ is the o-quinone diazide sulfonyl compound depicted above, Y is as defined above, X is the group reactive with a sulfonyl derivatives as set forth above inclusive of amine, hydroxyl, isocyanate, carboxy, thiol, etc., A is as defined above and B is a bonding group formed by reaction of the vinyl ether with the o-quinone diazide sulfonyl compound. The compounds of the invention are formed by mixing the DNQ sulfonyl compound with an equivalent amount of a vinyl compound at room temperature. Reaction times are from 3 to 24 hours and the compounds may be recovered by evaporation, all in accordance with conventional condensation procedures. It is believed that the product of the reaction is a new chemical compound.

To formulate a photoresist using the above compound, it would be mixed with a phenolic resin. On a solids basis, the resin would constitute from 65 to 98 percent by weight of the solids, preferably, from 75 to 98 percent by weight of total solids and more preferably, from about 85 to 96 percent by weight of the solids. The photoactive compound would comprise from about 2 to 20 percent by weight and preferably from 4 to 10 percent by weight. In addition to the resin binder and photoactive compound prepared in accordance with the invention, the balance of the composition would comprise other components conventionally added to photoresists as would be known to those skilled in the art. Typical additives include surfactants, dyes, sensitizers, etc.

The photoresist composition may be applied as a dry film or as a liquid coating composition. When applied as a liquid coating composition, the above components are dissolved in a suitable solvent. Typical solvents are known to those skilled in the art and include, by way of example, Cellosolve acetate, methyl Cellosolve acetate, ethyl Cellosolve acetate, propylene glycol monomethyl ether acetate, methyl lactate, ethyl lactate, 2-ethoxyethyl acetate, methyl pyruvate, ethyl pyruvate, methyl-3-methoxypropionate, ethyl-3- ethoxypropionate, N-methyl-2-pyrollidone, cyclohexanone, 2-hexanone, methyl ethyl ketone, 1,4-dioxane, ethylene glycol monoisopropyl ether, diethylene glycol monomethyl ether, diethylene glycol dimethyl ether, etc. When applied as a dry film, the film is applied to a substrate using heat and pressure at the time of application to a substrate such as Mylar.

For a liquid coating composition, the components of the photoresist are dissolved in one or more of the above solvents. When dissolved in a solvent, the concentration of total solids in the solvent may vary between 5 and 50 percent by weight and more preferably, between 15 and 40 percent by weight.

When the photoresist is in the form of a liquid coating composition, the composition is coated onto a substrate using art-recognized procedures such as spin coating, roller coating, doctoring, dipping, etc. Following application of the liquid coating composition to a substrate, the coated substrate is dried to remove solvents. Typical drying conditions comprise baking at a temperature of 50 to 120° C.

Following drying, the dried coating is exposed to activating radiation in a desired image pattern to form a latent image by phototransformation of the o-naphthoquinone diazide and cleavage of the bond between the PAC and the resin. Imaging may be at any conventional wavelength such as 365 nm, 436 nm, etc. Thereafter, the coating may be post-exposure baked and developed by contact with an alkaline developer. The post exposure bake typically comprises heating the coated substrates to a temperature between about 50 and 130° C.

In the above processing sequence, the step of exposure results in liberation of the indene carboxylic acid. The liberation of the indene carboxylic acid cleaves the acid labile group resulting in breaking of the bond between the PAC and the resin. The step of post exposure baking drives the cleavage reaction to completion. Cleavage of the bond and concomitant reformation of the phenolic hydroxyl group on the resin solubilizes the exposed areas of the photoresist coating thereby providing regions with the coating of increased differential solubility. Enhanced differential solubility permits development of the exposed photoresist coating to provide images of increased resolution.

The photoresists of the invention are used in conventional manner. For example, they may be coated over a printed circuit board substrate in printed circuit manufacture, over a semiconductor wafer for the manufacture of integrated circuits, over a glass substrate for the manufacture of LCD's, or over a metallic substrate for chemical milling applications.

The invention will be better understood by reference to the examples that follow.

EXAMPLE 1

This example illustrates the preparation of the sulfonamide of 2-diazo-1-naphthol-5-sulfonylchloride and 3-amino-1-propylvinylether.

A 1 liter, three neck round bottomed flask equipped with a reflux condenser, thermometer, magnetic stirrer, and ice bath was charged with 26.56 g (0.0989 mol) 2-diazo-1-naphthol-5-sulfonylchloride and 400 ml of methylene chloride. The reaction mixture was cooled to 20° C. with an ice bath then 20.00 g (0.1977 mol) 3-amino-1-propyl vinyl ether was added dropwise while maintaining the temperature between 20–25° C. The reaction mixture was stirred at 25° C. for 18 hours.

The reaction mixture was washed with water (3×) until pH=7. The organic phase was dried over $Na_2SO_4$, filtered, then evaporated to a dark brown solid. The crude product was dried under vacuum at 40° C. for 20 hours.

EXAMPLES 2–7

Three photoresist formulations were prepared using the photoactive compound prepared in Example 1 (identified as DNAPVE), a mixed m,p-cresol novolak resin dissolved in propylene glycol monomethyl ether acetate (identified as PMA) and other conventional additives. The photoresists so prepared had the following formulations:

TABLE 1

| Component | Formulation 1 | Formulation 2 | Formulation 3 |
|---|---|---|---|
| Cresol Novolac | 27.70 | 28.75 | 29.80 |
| DNAPVE | 3.50 | 2.45 | 1.40 |
| Plasticizers | 5.00 | 5.00 | 5.00 |
| Dyes | 0.30 | 0.30 | 0.30 |
| PMA | 63.50 | 63.50 | 63.50 |
| Total | 100.00 | 100.00 | 100.00 |

An additional formulation was prepared for purposes of comparison. The additional formulation had the same formulation as that set forth above except that the cresol novolak resin was reduced to 16.2 parts and the PAC was the naphthoquinone diazide sulfonyl halide used in Example 1 condensed with a trihydroxybenzophenone ballast group. The PAC was used in an amount of 15 parts by weight.

The photoresists identified above were used to coat copper clad substrates. The substrates selected for coating were 0.060 double sided copper clad epoxy panels measuring 12 inches by 15 inches. The substrates were prepared by passing the same through International Suppliers Scrubber, Serial No. 8448. The panel was used shortly after scrubbing. The panels were then coated with the above described liquid coating resist using a No. 15 Myar Rod by placing the rod at the top of the panel to be coated, applying the coated resist on the leading edge of the Myar Rod from a pipette, and drawing the Myar Rod down the panel with a light even pressure at a draw down rate of about 4 inches per second. A 0.25 ml. wet thickness coating was obtained using the No. 15 rod for each of the formulations identified above.

Following coating of the photoresist sample onto the substrate, the substrate coated with the wet photoresist was placed in racks in a convection oven and baked for 10 minutes at 80° C. Following drying of the photoresist, the coated substrate is placed in the center of an exposure frame with the photoresist facing upward. A Stouffer 21 Step tablet was placed on a portion of the photoresist with the emulsion side down. Plating tape was coated over another portion of the coating. A vacuum was placed on the exposure frame and the photoresist coating exposed a 25 Kilowatts through the Stouffer tablet at an exposure energy of 100 or 200 mJ.

Following exposure, the imaged photoresist coating was developed by immersion of the substrate into a 0.23 Normal sodium hydroxide developer maintained at 30° C. The panel was vigorously agitated back and forth in the developer until all of the photoresist was removed from the highest step of the Stouffer tablet. This is called the breakpoint. Development of the panel is continued for twice the time necessary to reach the breakpoint. The panel is then rinsed for 10 seconds under running water and then blown dry.

Following the above procedure, the step number of the highest step completely free of photoresist was noted and the thickness lost of the exposed resist determined. The following results were obtained.

TABLE 2

| Formulation No. | Dry Thickness (mil) | Thickness (mil)[1] | Step[2] # | DMT[3] Sec. | UEFL[4] % | DNAPVE % by weight | Exposure |
|---|---|---|---|---|---|---|---|
| 1 | 0.250 | 0.269 | 5 | 35 | 7.6 | 10 | 100 |
| 1 | 0.263 | 0.255 | 3 | 40 | −3 | 10 | 200 |
| 2 | 0.230 | 0.205 | 7 | 55 | −11 | 7 | 100 |
| 2 | 0.242 | 0.247 | 4 | 50 | 2 | 7 | 200 |
| 3 | 0.242 | 0.200 | 11 | 85 | −92 | 4 | 100 |
| 3 | 0.243 | 0.220 | 4 | 90 | −9.5 | 4 | 200 |
| Comparative | 0.250 | 0 | — | 5 | −100 | — | 200 |
| Comparative | 0.250 | 0 | — | 5 | −100 | — | 100 |

[1] After Development
[2] Stouffer Stepper, Step Number
[3] Developed break time
[4] Unexposed film loss Comparison of the comparative examples with Formulations Numbers 1 to 3 illustrate the benefits obtained from the invention described herein.

We claim:

1. A compound that is the reaction product of a vinyl ether and a o-naphthoquinone diazide sulfonyl halide, the reaction product obtainable by mixing the vinyl ether and o-napthoquinone diazide sulfonyl halide at room temperature from about 3 to 24 hours.

2. The compound of claim 1 that is the reaction product of the vinyl ether and an o-naphthoquinone diazide sulfonyl compound conforming to the following formula:

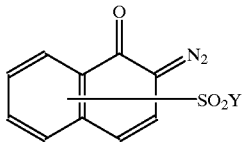

where Y is a member selected from the group consisting of halogen, hydroxyl, amine and —OM where M is an alkali or alkaline earth metal.

3. The compound of claim 1 where the vinyl ether is functionalized to react with the o-naphthoquinone diazide sulfonyl compound.

4. The compound of claim 3 where the functional group reactive with the o-naphthoquinone diazide sulfonyl compound is selected from the group consisting of amine, hydroxyl, isocyanate, carboxy and thiol.

5. The compound of claim 3 where the functional group is an amine.

6. The compound of claim 3 where the functional group is hydroxyl.

7. The compound of claim 3 where the vinyl ether has a structural formula selected from the group consisting of:

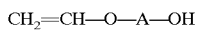

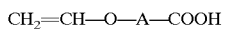

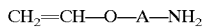

where A represents a linear or branched alkylene group having 1 to 10 carbon atoms.

8. A compound conforming to the formula:

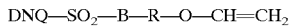

where DNQ represents an o-naphthoquinone diazide group, R is a hydrocarbon having from 1 to 10 carbon atoms and —SO$_2$—B— is a group formed by condensing a sulfonyl ester with a member selected from the group consisting of amine, hydroxyl, isocyanate, carboxy and thiol.

9. The compound of claim 8 where the o-naphthoquinone diazide sulfonyl compound conforms to the formula:

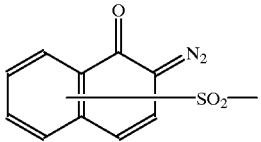

* * * * *